United States Patent
Lin et al.

(10) Patent No.: US 9,370,110 B2
(45) Date of Patent: Jun. 14, 2016

(54) METHOD OF MANUFACTURING A MULTILAYER SUBSTRATE STRUCTURE FOR FINE LINE

(71) Applicant: KINSUS INTERCONNECT TECHNOLOGY CORP., Taoyuan (TW)

(72) Inventors: Ting-Hao Lin, Taipei (TW); Yu-Te Lu, Taoyuan Hsien (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 239 days.

(21) Appl. No.: 14/225,682

(22) Filed: Mar. 26, 2014

(65) Prior Publication Data

US 2015/0282333 A1   Oct. 1, 2015

(51) Int. Cl.
*H05K 3/46* (2006.01)
*H05K 3/00* (2006.01)
*H05K 3/10* (2006.01)
*H05K 3/28* (2006.01)
*H05K 3/34* (2006.01)

(52) U.S. Cl.
CPC .......... *H05K 3/4611* (2013.01); *H05K 3/0094* (2013.01); *H05K 3/10* (2013.01); *H05K 3/28* (2013.01); *H05K 3/3452* (2013.01); *H05K 2203/06* (2013.01); *H05K 2203/0723* (2013.01); *H05K 2203/143* (2013.01)

(58) Field of Classification Search
CPC ........ H05K 3/4611; H05K 3/094; H05K 3/10; H05K 3/28; H05K 3/3452
See application file for complete search history.

(56) References Cited

U.S. PATENT DOCUMENTS

| | | | | |
|---|---|---|---|---|
| 2001/0030059 A1* | 10/2001 | Sugaya | ........... | H01L 21/56 174/256 |
| 2002/0127379 A1* | 9/2002 | Suzuki | ........... | H05K 1/0366 428/209 |
| 2008/0102410 A1* | 5/2008 | Kim | ........... | H01L 21/4857 430/312 |

* cited by examiner

*Primary Examiner* — Daniel McNally
(74) *Attorney, Agent, or Firm* — Lin & Associates Intellectual Property, Inc.

(57) ABSTRACT

A method of manufacturing a multilayer substrate structure includes the steps of pre-treatment, pressing and post-treatment. A carrier plate provided with a circuit pattern layer is pressed against a plastic sheet. An interlayer connection pad is formed by drilling and filling the lower surface of the plastic sheet. The carrier plate, the plastic sheet, another plastic sheet and another carrier plate with a circuit pattern layer are pressed together, and then drilled/filled to form a multilayer stacked structure such that the two circuit pattern layers are indirectly and electrically connected to the interlayer connection pad, respectively. Therefore, it is possible to overcome the problem due to alignment tolerance by using the interlayer connection pad wider than alignment tolerance, and stacking the circuit layers, each having much finer line and smaller pitch.

7 Claims, 18 Drawing Sheets

METHOD OF MANUFACTURING A MULTILAYER SUBSTRATE STRUCTURE FOR FINE LINE

BACKGROUND OF THE INVENTION

1. Field of the Invention

The present invention generally relates to a method of manufacturing a multilayer substrate structure, and more specifically to a method of manufacturing a multilayer substrate structure for fine line by forming an interlayer connection pad after the process of drilling and filling so as to overcome alignment tolerance and improve the yield rate of products.

2. The Prior Arts

FIGS. 1A to 1D schematically and respectively illustrate the successive steps of manufacturing a multilayer substrate structure in the prior arts. As shown in FIG. 1A, a substrate 10 is provided with two seed layers 20 on the upper and lower surfaces by electroplating, respectively, and two patterned photo resist layers 200 are then formed on the two seed layers 20, respectively. Next in FIG. 1B, a first circuit pattern layer 30 and a second circuit pattern layer 32 are formed at the openings of the surfaces of the two patterned photo resist layers 200, respectively. The first circuit pattern layer 30 includes a first circuit pattern 31 and a first connection pad 33, and similarly the second circuit pattern layer 32 includes a second circuit pattern 37 and a second connection pad 39. The second connection pad 39 has a shape of a ring with a central region 40. In FIG. 1C, the patterned photo resist layers 200 and the seed layers 20 are removed, and an opening 100 is formed by drilling the central region 40 of the second connection pad 39. Specifically, the opening 100 stops at the first connection pad 33. Further referring to FIG. 1D, the opening 100 and the central region 40 are filled with metal by electroplating such that the first circuit pattern 31 is electrically connected to the second circuit pattern layer 32. Finally, a first solder mask 51 and a second solder mask 53 are formed on the upper surfaces of the first circuit pattern layer 30 and the second circuit pattern layer 32, respectively. The first solder mask 51 covers most of the first circuit pattern 31 and part of the first connection pad 33, and the second solder mask 53 covers most of the second circuit pattern 37 and part of the second connection pad 39. One shortcoming of the above example in the prior arts is that the seed layers 20 are located on the first circuit pattern 31 and the second circuit pattern layer 32, and the seed layers 20 are removed by etching. As a result, part of the first circuit pattern 31 and the second circuit pattern layer 32 are possibly removed at the same time, and it is thus needed to increase the width of the first circuit pattern 31 and second circuit pattern layer 32 with specific width for circuit compensation. Traditionally, the thickness of the seed layers 20 is about 1 to 2 μm, and the typical width and pitch for the present technology are about 10 μm such that the loss due to etching is up to 20 to 40%, resulting in challenging bottleneck in technology.

For another example in the prior arts, FIGS. 2A to 2D respectively illustrate the steps of manufacturing the multilayer substrate structure. The present example is intended to improve the circuit compensation for etching in the first example so as to implement much finer line and achieve much denser circuitry. As shown in FIG. 2A, two steel plates 500 and a plastic sheet 12 are prepared. Each steel plate 500 is provided with a seed layer 20 by electroplating, and a first circuit pattern layer 30 and a second circuit pattern layer 32 are formed by the image transfer process, respectively. Then in FIG. 2B, the two steel plates 500 and the plastic sheet 12 are pressed together so as to embed the first circuit pattern layer 30 and the second circuit pattern layer 32 into the plastic sheet 12. The two steel plates 500 and the seed layers 20 are removed. The steps shown in FIGS. 2C and 2D are similar to the first example. A first opening 100 is formed by drilling, and then filled with metal by electroplating to form a first solder mask 51 and a second solder mask 53. The seed layers 20 are located on the upper and lower surfaces after removing the steel plates 500 such that the first circuit pattern layer 30 and the second circuit pattern layer 32 are not affected during the step of removing. Therefore, it is no need to design larger width for circuit compensation.

However, the actual situation is possibly like what FIGS. 2B' and 2C' show. Because of certain tolerance of the machine used in the step of pressing, typically about 40 to 100 μm, the position of the circuit while pressed is possibly what FIG. 2B' shows. That is, the first circuit pattern layer 30 and the second circuit pattern layer 32 obviously deviate from the preset position. Therefore, it is possible to penetrate the plastic sheet 12 while drilling by laser, if the first connection pad 33 and the second connection pad 39 are offset too much. Owing to the alignment tolerance larger than the width, it needs a method of manufacturing a multilayer substrate structure without circuit compensation so as to overcome the drawbacks in the prior arts.

SUMMARY OF THE INVENTION

The primary object of the present invention is to provide a method of manufacturing a multilayer substrate structure for fine line, which includes the steps of pre-treatment, pressing and post-treatment. The step of pre-treatment includes the steps of first preparation, first pressing, first drilling and first filling.

In the step of first preparation, a first plastic sheet and a first carrier plate with a first circuit pattern layer are prepared, and the first circuit pattern layer includes a first circuit pattern and a first connection pad.

In the step of first pressing, the first carrier plate is pressed against the first plastic sheet, and the first circuit pattern layer is embedded into the upper surface of the first plastic sheet. In the step of first drilling, the lower surface of the first plastic sheet with respect to the first connection pad is drilled to form a first opening. In the step of first filling, the first opening is filled with an electrically conductive material to form a first connection plug, an interlayer connection pad is made from the electrically conductive material on the lower surface of the first plastic sheet, and the interlayer connection pad is connected to the first connection plug. Thus, a first stacked structure is formed after the step of pre-treatment.

The step of pressing is to press the first stacked structure, a second plastic sheet and a second carrier plate with a second circuit pattern layer such that the lower surface of the first plastic sheet is connected to the upper surface of the second plastic sheet, and the second circuit pattern layer is embedded into the lower surface of the second plastic sheet. The interlayer connection pad is covered by the upper surface of the second plastic sheet, and the second circuit pattern layer includes a second circuit pattern and a second connection pad. The second connection pad has a shape of a ring with a central region.

The step of post-treatment includes the steps of removing, second drilling and second filling. The first and second carrier plates are removed in the step of removing so as to expose the first and second circuit pattern layers to the upper surface of the first plastic sheet and the lower surface of the second plastic sheet, respectively. The lower surface of the second plastic sheet is drilled with respect to the second connection pad to form at least one second opening in the step of second drilling. The second opening stops at the interlayer connection pad. In the step of second filling, the second opening is filled with the electrically conductive material to form a second connection plug, which is connected to the interlayer connection pad. A core stacked structure is thus formed.

Furthermore, it is possible to stack other plastic sheets, interlayer connection pads and circuit pattern layer onto the core stacked structure in that way, so as to form a final stacked structure with more stacked layers. Finally, solder masks are formed on the upper and lower surfaces of the final stacked structure to achieve the process of package.

According to one feature of the present invention, the interlayer connection pad is provided between the circuit pattern layers such that the circuit pattern layers are electrically connected via the interlayer connection pad. That is, the present invention implements indirect connection for the circuit pattern layers. Particularly, the width of the interlayer connection pad is intentionally larger than alignment tolerance, thereby overcoming the problem due to alignment tolerance. The final stacked structure includes the circuits with much finer line and smaller pitch.

BRIEF DESCRIPTION OF THE DRAWINGS

The present invention can be understood in more detail by reading the subsequent detailed description in conjunction with the examples and references made to the accompanying drawings, wherein:

FIGS. 2B' to 2C' respectively are cross sectional views showing the actual situation in the prior arts;

DETAILED DESCRIPTION OF THE PREFERRED EMBODIMENTS

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1A:
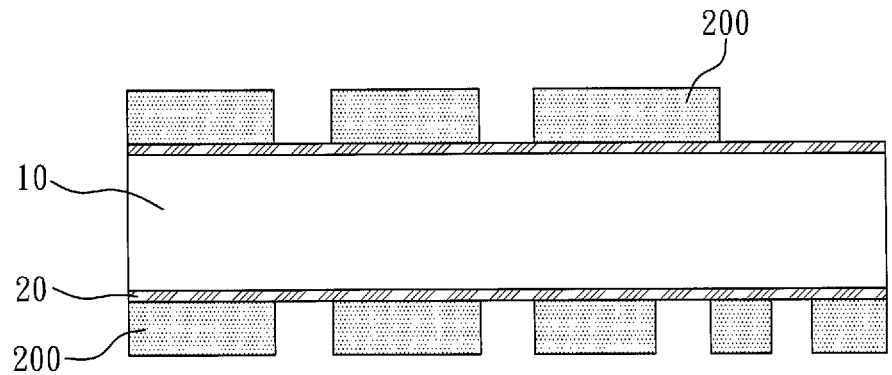
FIGS. 1A to 1D respectively are cross sectional views illustrating the steps of manufacturing the multilayer substrate structure in the prior arts.
Figure 1B:
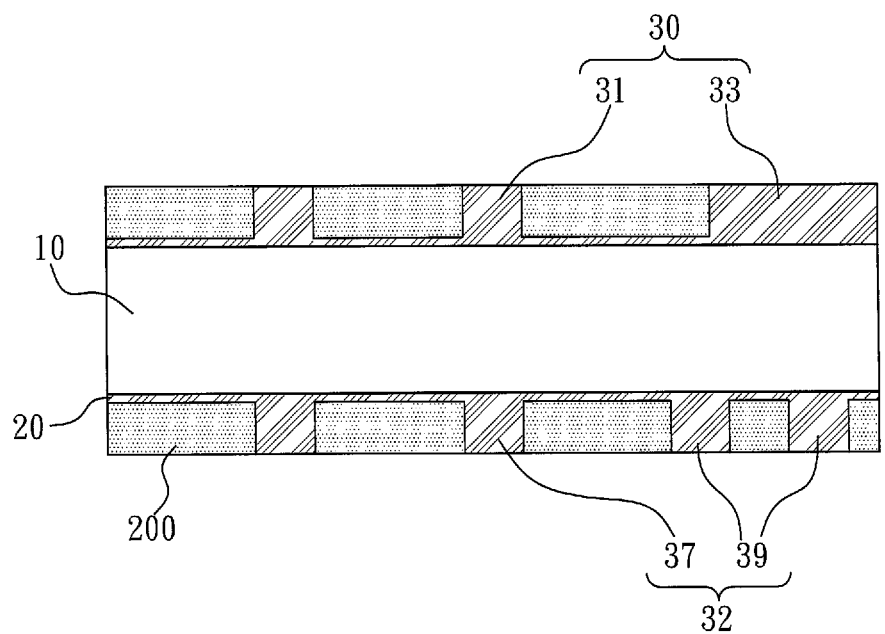
Figure 1C:
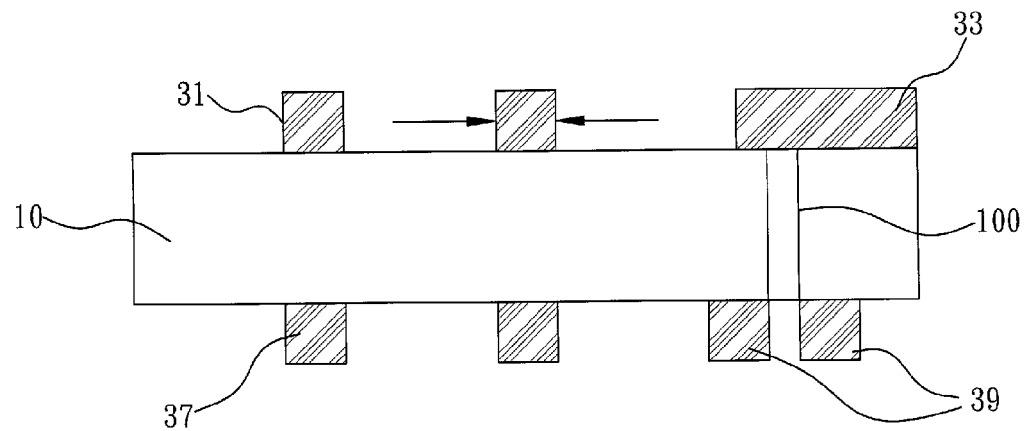
Figure 1D:
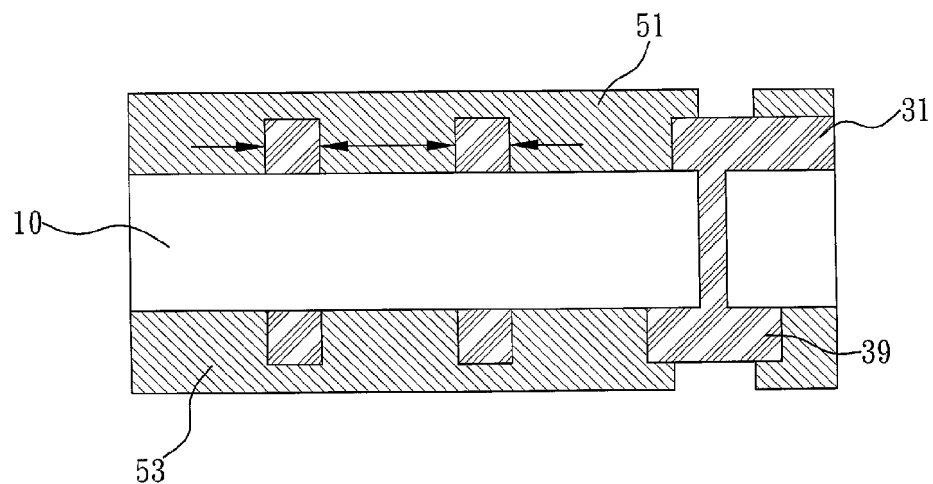
Figure 2A:
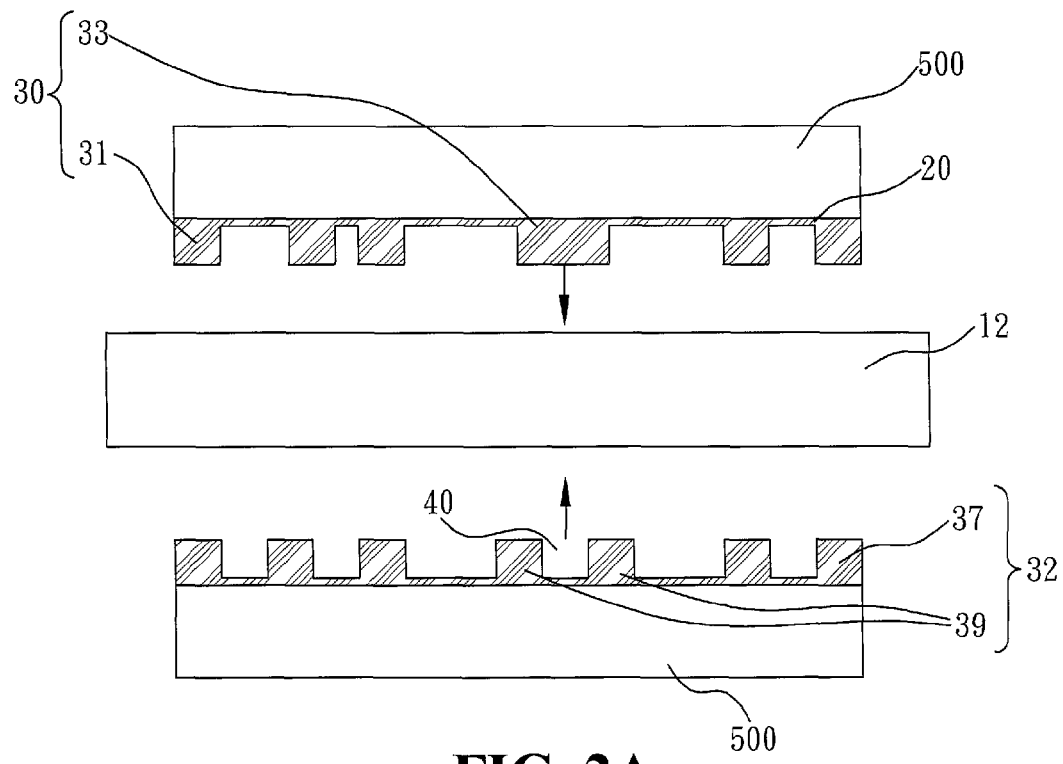
FIGS. 2A to 2D respectively are cross sectional views illustrating the steps of manufacturing the multilayer substrate structure in another example of the prior arts.
Figure 2B:
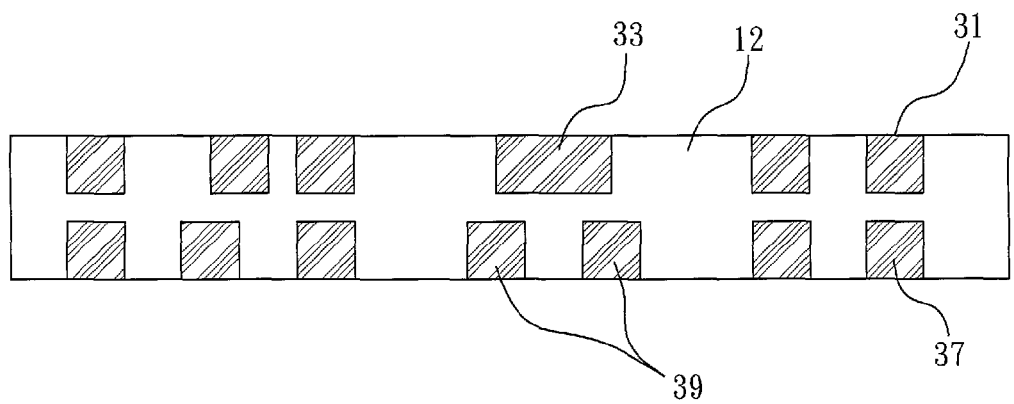
Figure 2C:
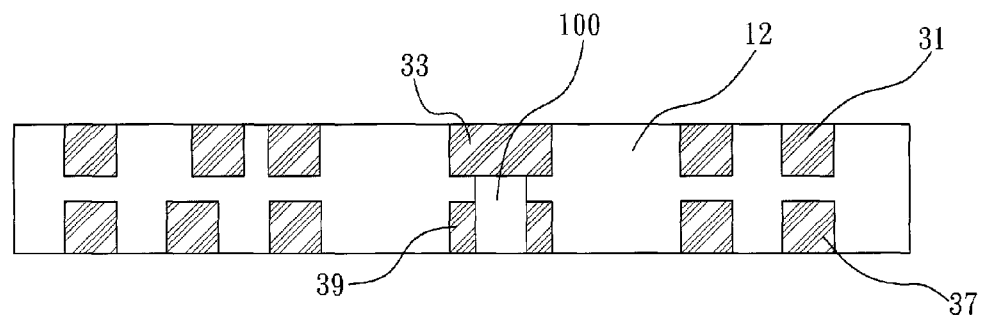
Figure 2D:
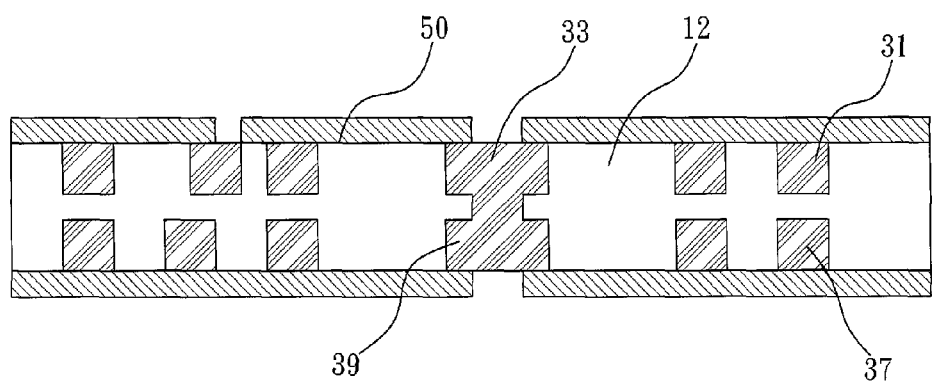
Figure 2B:
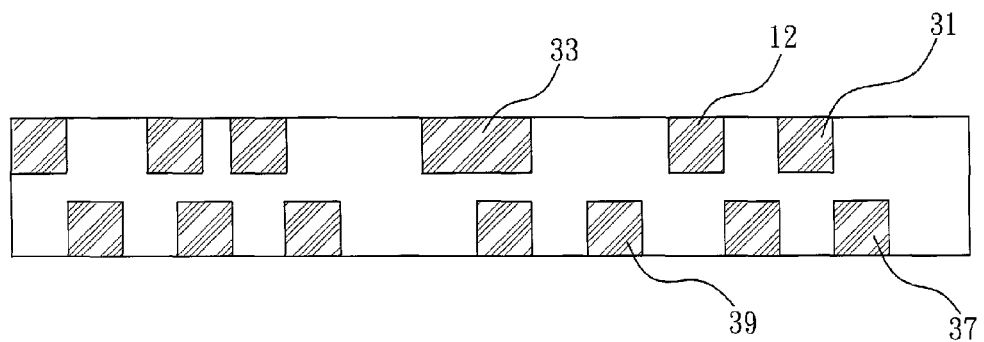
Figure 2C:
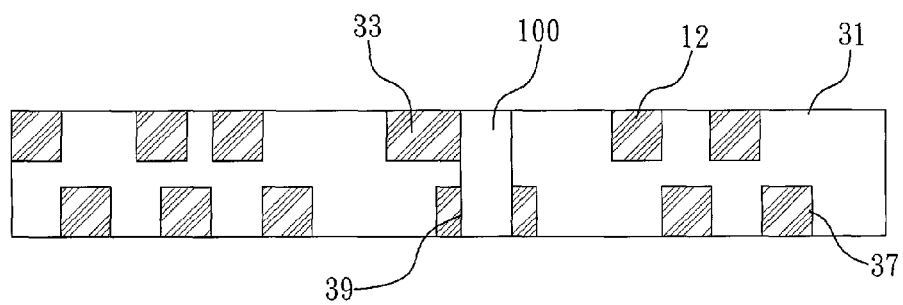
Figure 3:
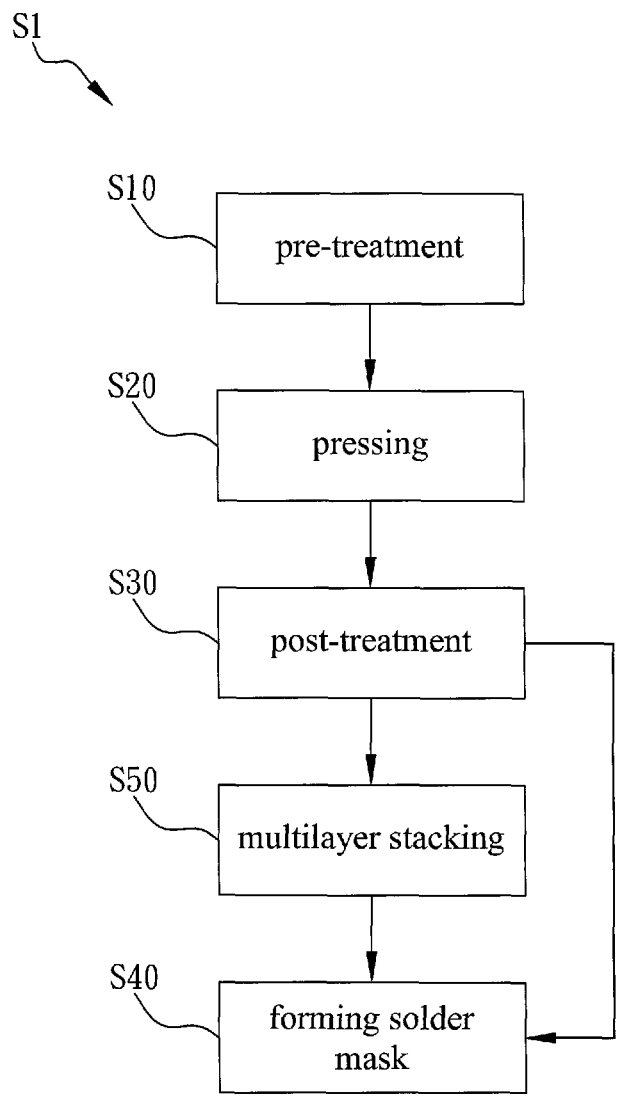
FIG. 3 is a flow diagram showing the method of manufacturing a multilayer substrate structure for fine line according to the present invention.

Referring to FIG. 3, a flow diagram showing the method of manufacturing the multilayer substrate structure for fine line according to the present invention.

Figure 4A:
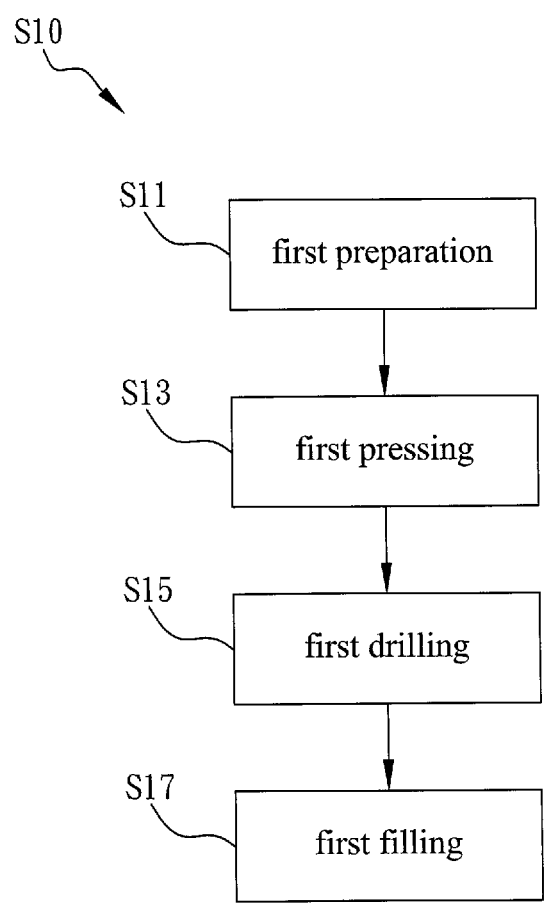
FIGS. 4A and 4B respectively are detailed flow diagrams showing the pre-treatment and post-treatment steps.
Figure 4B:
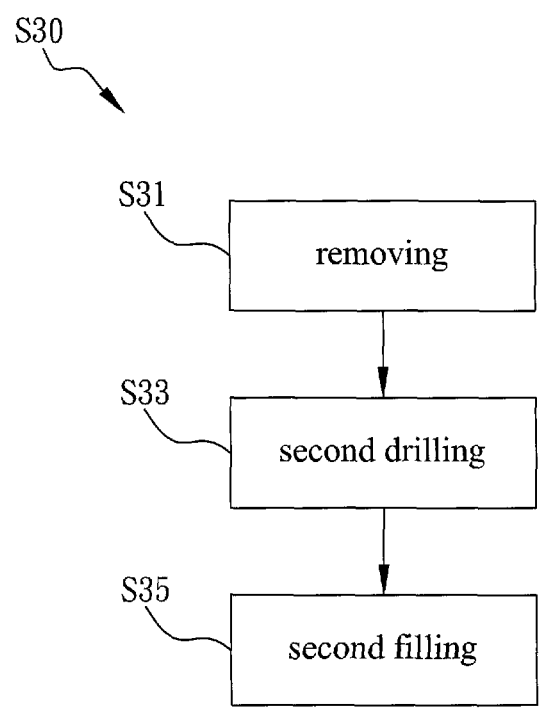

As shown in FIG. 3, the method of the present invention includes the steps of pre-treatment S10, pressing S20, post-treatment S30 and forming solder mask S40. FIGS. 4A and 4B are detailed flow diagrams showing the steps of pre-treatment S10 and post-treatment S30, respectively. FIGS. 5A to 5I respectively show the cross sectional views for each step in the method of the present invention.

Figure 5A:
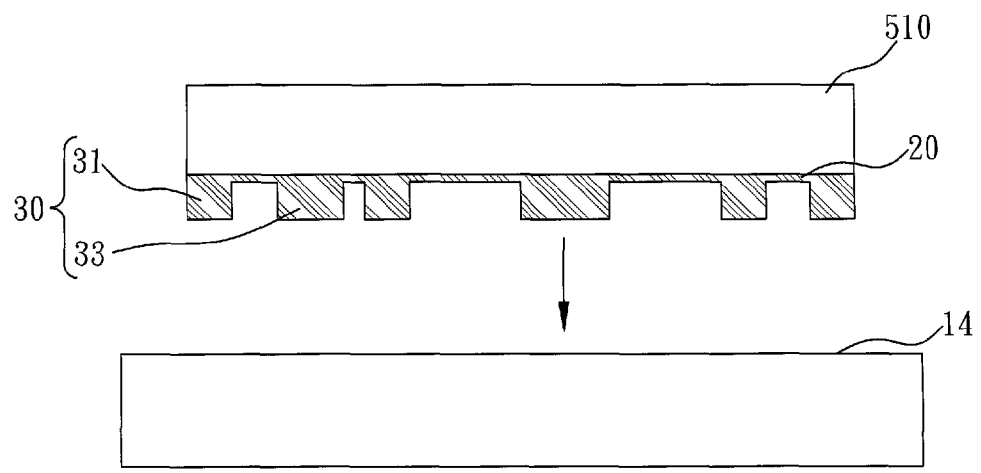
FIGS. 5A to 5I respectively are cross sectional views illustrating the method of manufacturing the multilayer substrate structure according to the present invention.
Figure 5B:
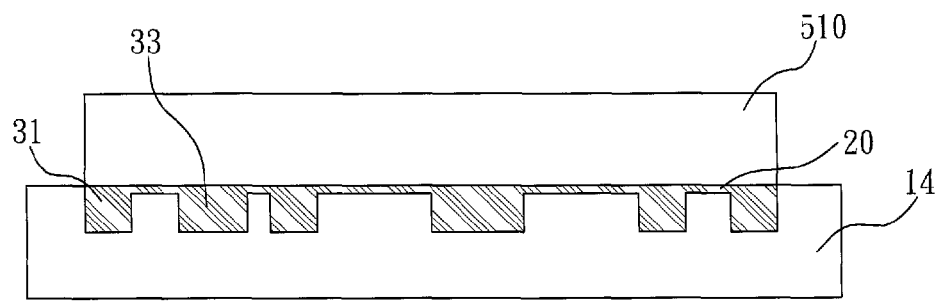
Figure 5C:
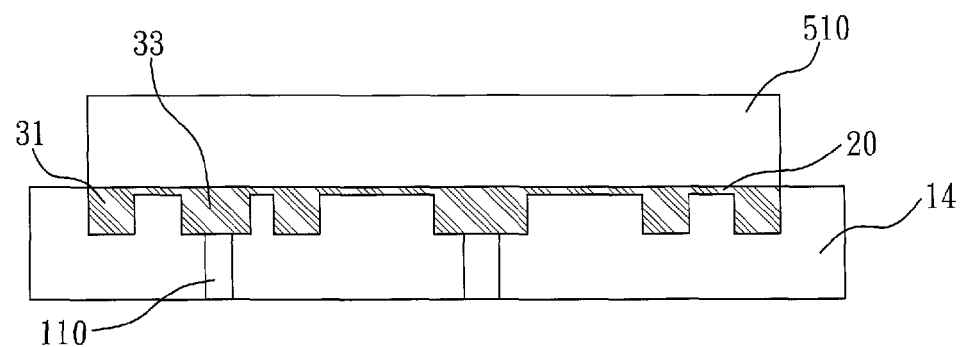
Figure 5D:
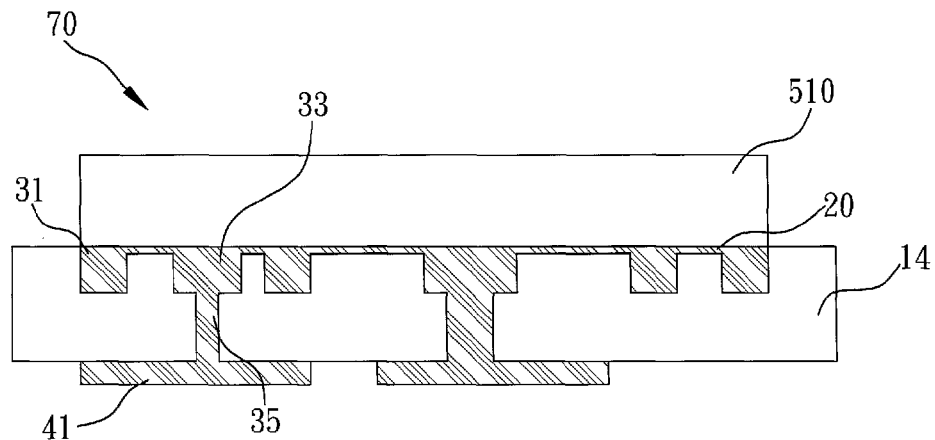

As shown in FIG. 4A, the pre-treatment step S10 includes the steps of first preparation S11, first pressing S13, first drilling S15 and first filling. For the step of first preparation S11, it is shown in FIG. 5A that a first plastic sheet 14 and a first carrier plate 510 with a first circuit pattern layer 30 are prepared. An electroplated seed layer 20 is formed between the first circuit pattern layer 30 and the first carrier plate 510. The first circuit pattern layer 30 includes a first circuit pattern 31 and a first connection pad 33. In FIG. 5B, the step of first pressing S13 is to press the first carrier plate 510 against the first plastic sheet 14 such that the first circuit pattern layer 30 is embedded into the upper surface of the first plastic sheet 14. Next, it is shown in FIG. 5C that the step of first drilling S15 is to drill a first opening 110 in the lower surface of the first plastic sheet 14 to align with the first connection pad 33. The first opening 110 stops at the first connection pad 33. In the step of first filling S17, the first opening 110 is filled with an electrically conductive material by electroplating or non-electroplating to form a first connection plug 35 as shown in FIG. 5D. At the same time, an interlayer connection pad 41 is formed on the lower surface of the first plastic sheet 14, which is connected to the first connection plug 35, and a first stacked structure 70 is thus formed. The width of the interlayer connection pad 41 is 40 to 100 μm.

Figure 5E:
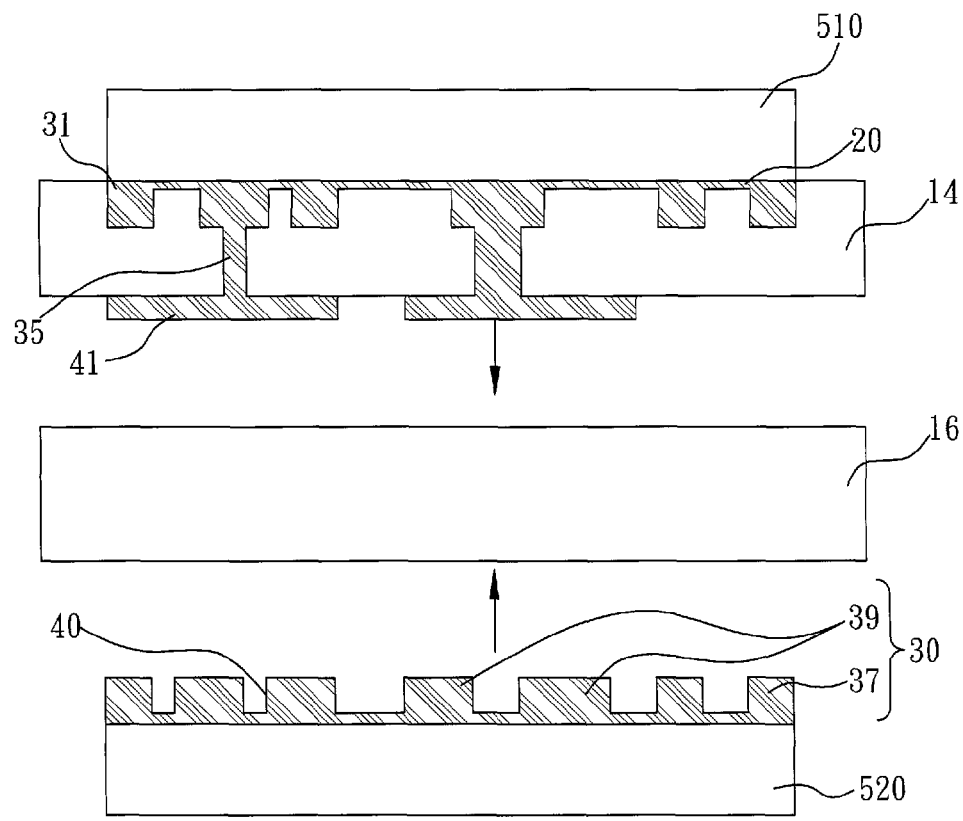

As shown in FIG. 5E, the step of pressing S20 is to press the first stacked structure 70, a second plastic sheet 16 and the second carrier plate 520 with a second circuit pattern layer 32 such that the lower surface of the first plastic sheet 14 is connected to the upper surface of the second plastic sheet 16. Additionally, the second circuit pattern layer 32 is embedded into the lower surface of the second plastic sheet 16 such that the interlayer connection pad 41 is embedded into the upper surface of the second plastic sheet 16. The electroplated seed layer 20 is formed between the second circuit pattern layer 32 and the second carrier plate 520. The second circuit pattern layer 32 includes a second circuit pattern 37 and at least one second connection pad 39. The second connection pad has a shape of a ring with a central region 40.

Figure 5F:
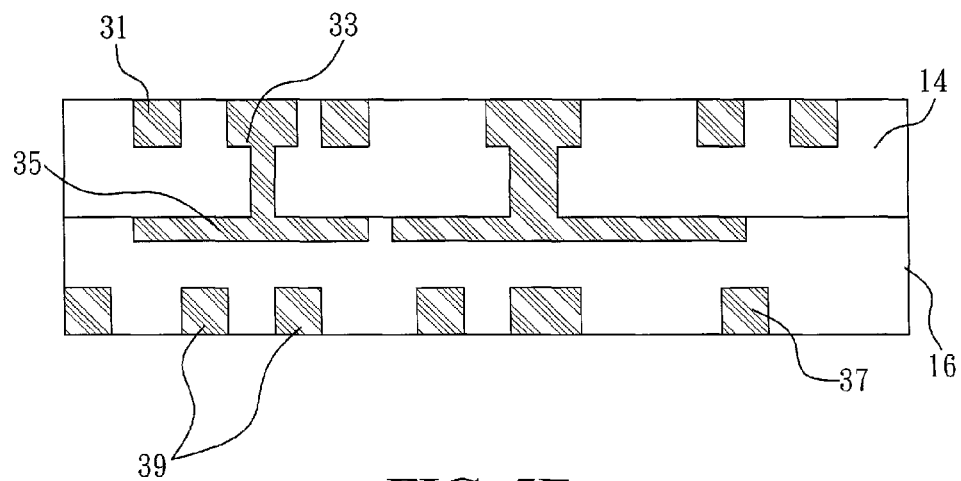
Figure 5G:
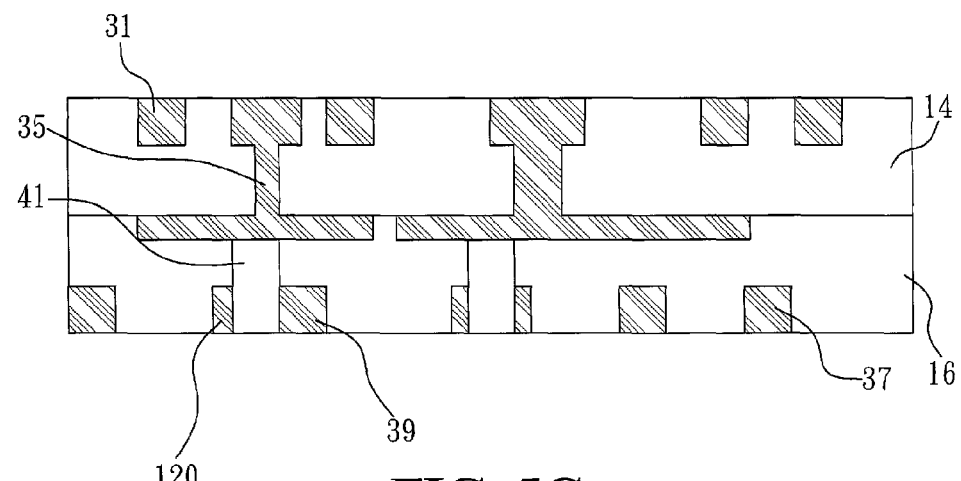
Figure 5H:
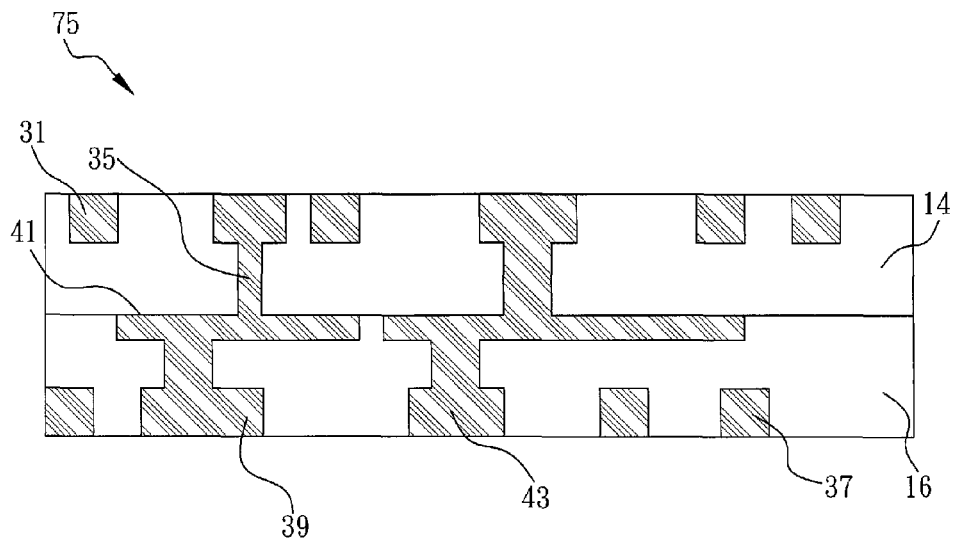

The step of post-treatment S30 includes the steps of removing S31, second drilling S33 and second filling S35. As shown in FIG. 5F, the step of removing is to remove the first carrier plate 510, the second carrier plate 520 and the electroplated seed layer 20 so as to expose the first circuit pattern layer 30 and the second circuit pattern layer 32 to the upper surface of the first plastic sheet 14 and the lower surface of the second plastic sheet 16, respectively. For the step of second drilling S33, it is clearly shown in FIG. 5G to drill the second openings 120 in the lower surface of the second plastic sheet 16 such that the second opening is in alignment with the central region 40 of the second connection pad 39 so that the second opening 120 stops at the interlayer connection pad 41. Next, as shown in FIG. 5H, the step of second filling S35 is to fill the second openings 120 with the electrically conductive material by electroplating or non-electroplating to form the second connection plugs 43. Thus, the core stacked structure 75 is formed. Specifically, the second connection plug 43 is connected to the interlayer connection pad 41 such that the first circuit pattern layer 30 and the second circuit pattern layer 32 are electrically connected via the first connection plug 35.

Figure 5I:
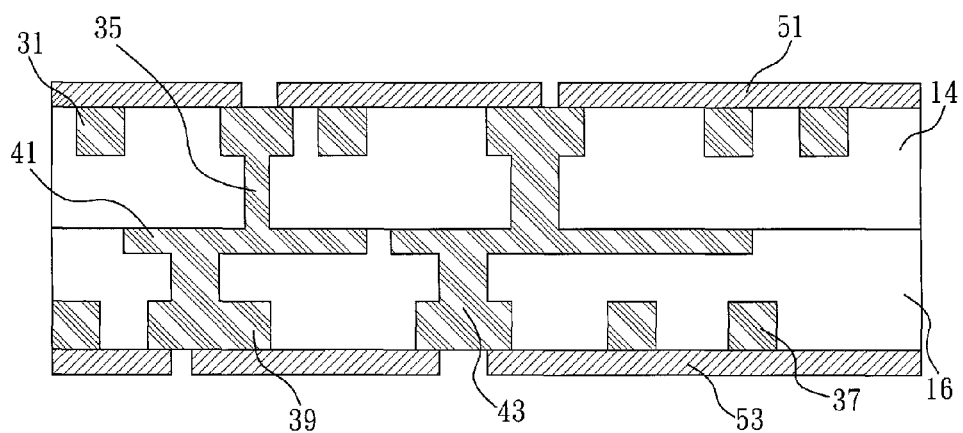

Finally, the step of solder mask S40 is shown in FIG. 5I to form the first solder mask 51 and the second solder mask 53 on the upper and lower surfaces of the core stacked structure 75, respectively. The first solder mask 51 is provided on the upper surface of the first plastic sheet 14 and covers the first circuit pattern layer 31 and part of the first connection pad 33. Similarly, the second solder mask 53 is provided on the lower surface of the second plastic sheet 16 and covers the second circuit pattern layer 37 and part of the second connection pad 39.

Figure 6:
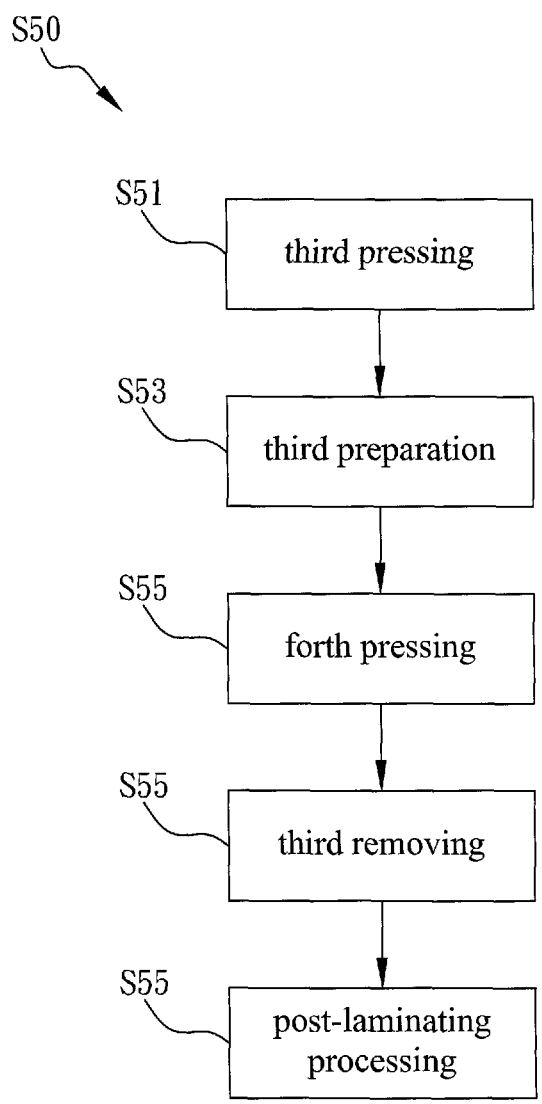
FIG. 6 is a flow diagram showing the step of preparation according to the present invention.

Furthermore, referring again to FIG. 3, the method of the present invention may include a step of multilayer stacking S50 before the step of solder mask S40. As shown in FIG. 6, the step of multilayer stacking S50 includes the steps of third pressing S51, third preparation S53, fourth pressing S55, third removing S57, and post-laminating process S59. For more detailed description of the step of multilayer stacking S50, please refer to FIGS. 7A to 7E which illustrate the corresponding cross sections.

Figure 7A:
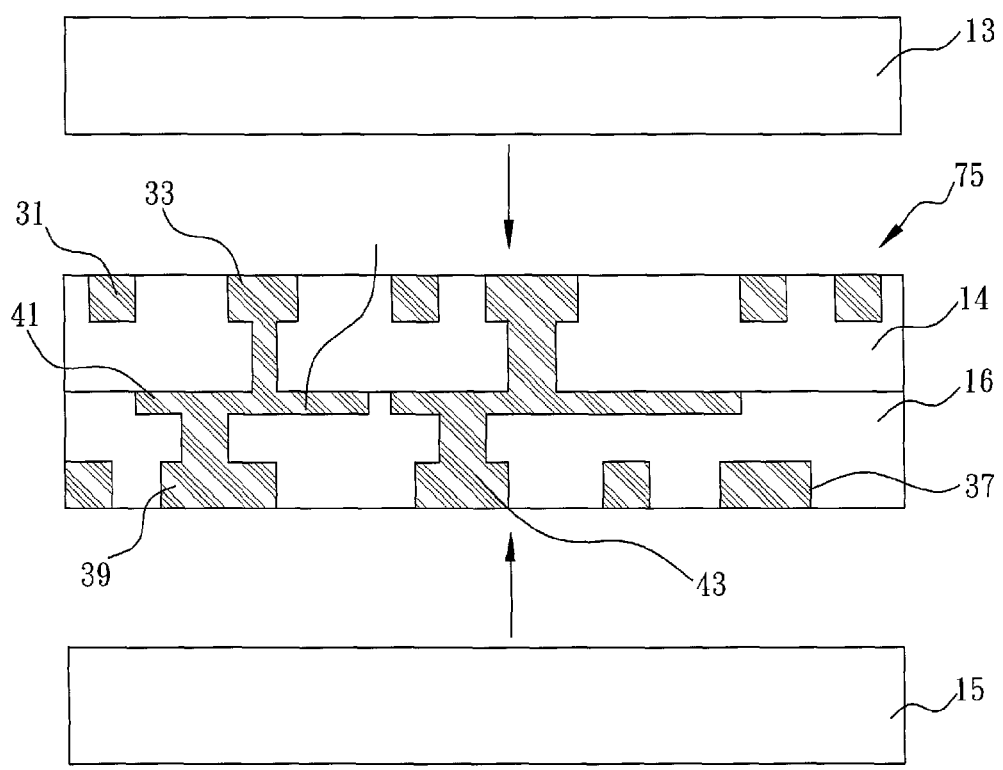
FIGS. 7A to 7E respectively are cross sectional views illustrating the step of manufacturing the stacked multilayer according to the present invention.
Figure 7B:
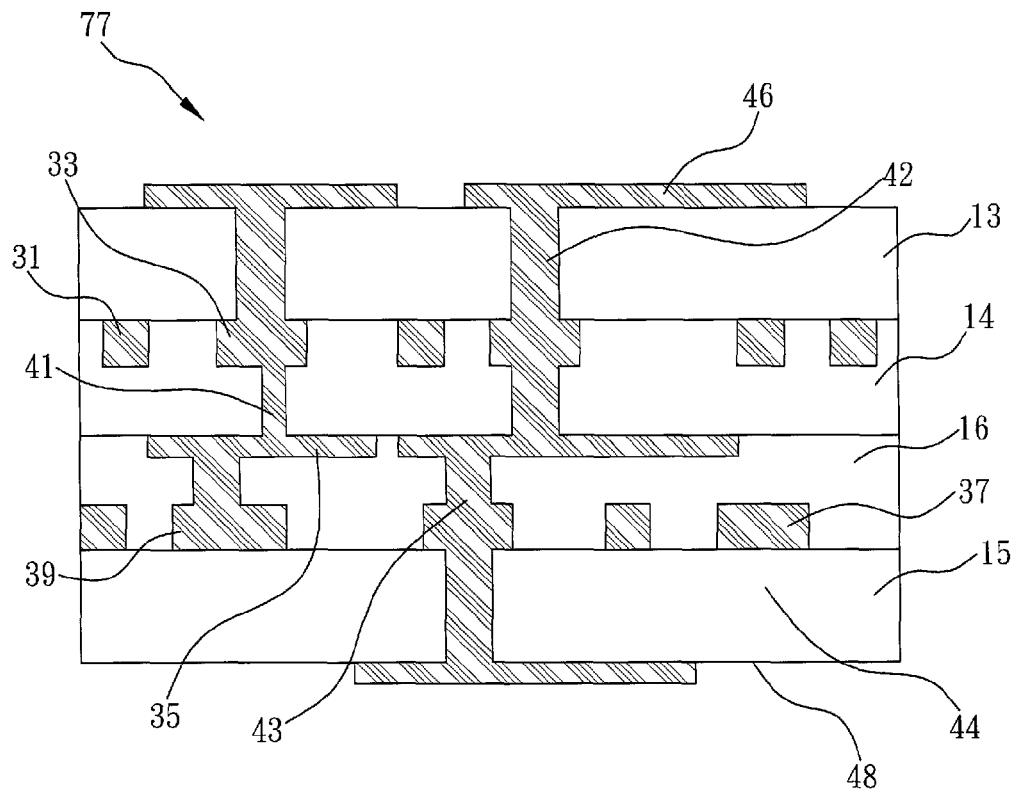
Figure 7C:
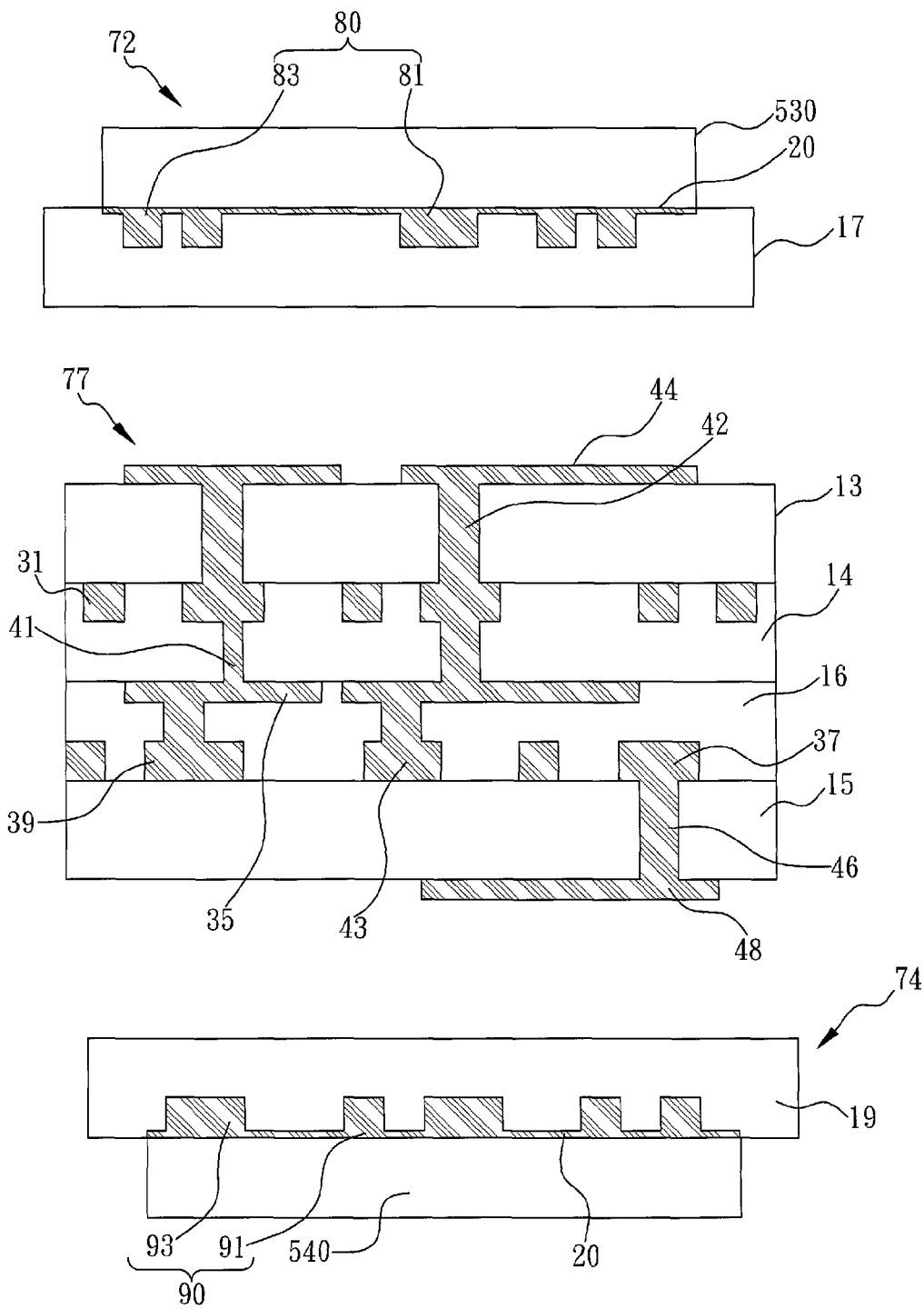

In FIG. 7A, the step of third pressing S51 is to press a third plastic sheet 13 and a fourth plastic sheet 15 on the top and the bottom of the core stacked structure 75 shown in FIG. 5H, respectively. As shown in FIGS. 7B and 7C, the step of third preparation S53 is forming third connection plugs 42 in the third plastic sheet 13 and forming fourth connection plugs 44 in the fourth plastic sheet 15 by using drilling and filling as the pre-treatment step S10. The third connection plugs 42 and the fourth connection plugs 44 connect to the first connection pads 33 and the second connection pad 39, respectively. Then, forming second interlayer connection pads 46 corresponding to the third connection plugs 42 on the upper surface of the third plastic sheet 13 and forming third interlayer connection pads 48 corresponding to the fourth connection plugs 44 on the lower surface of the fourth plastic sheet 15 to form a pre-laminating structure 77 as shown in FIG. 7B by plating the conductive material. The width of the second interlayer connection pads 46 and the third interlayer connection pads 48 is 40~100 μm.

The step of third preparation S53 is to form a second stacked structure 72 and a third stacked structure 74 by using the similar step of first preparation S11. The second stacked structure 72 includes a third carrier plate 530, a third circuit pattern layer 80 formed on the lower surface of the of the third carrier plate 530, an electroplated seed layer 20 formed between the third carrier plate 530 and the third circuit pattern layer 80, and a fifth plastic sheet 17. The third circuit pattern layer 80 includes the third circuit pattern 81 and the third connection pad 83 in form of a ring, and is embedded into the upper surface of the fifth plastic sheet 17. The third stacked structure 74 includes a fourth carrier plate 540, a fourth circuit pattern layer 90 formed on the upper surface of the of the fourth carrier plate 540, an electroplated seed layer 20 formed between the fourth carrier plate 540 and the fourth circuit pattern layer 90, and a sixth plastic sheet 19. The third circuit pattern layer 80 includes the fourth circuit pattern 91 and the fourth connection pad 93 in form of a ring, and is embedded into the lower surface of the sixth plastic sheet 19.

Figure 7D:
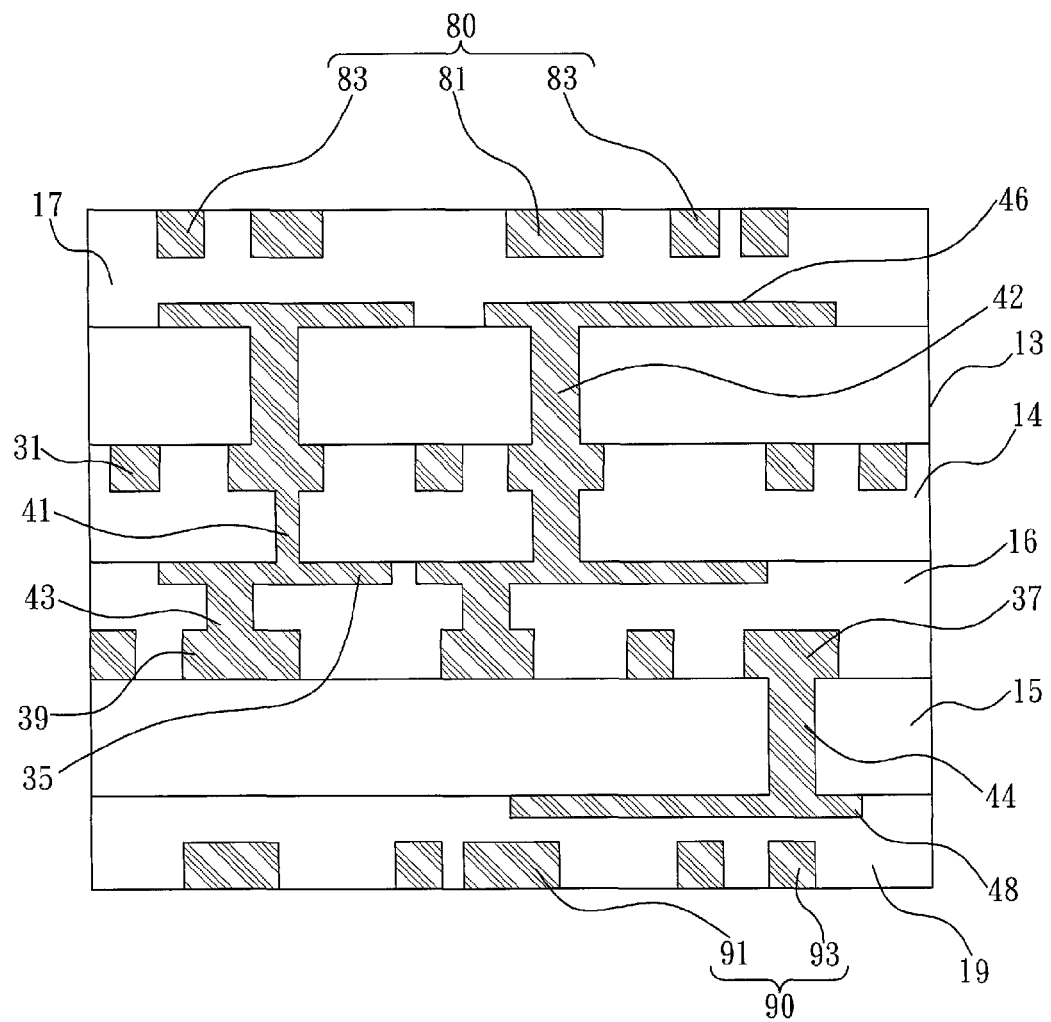
Figure 7E:
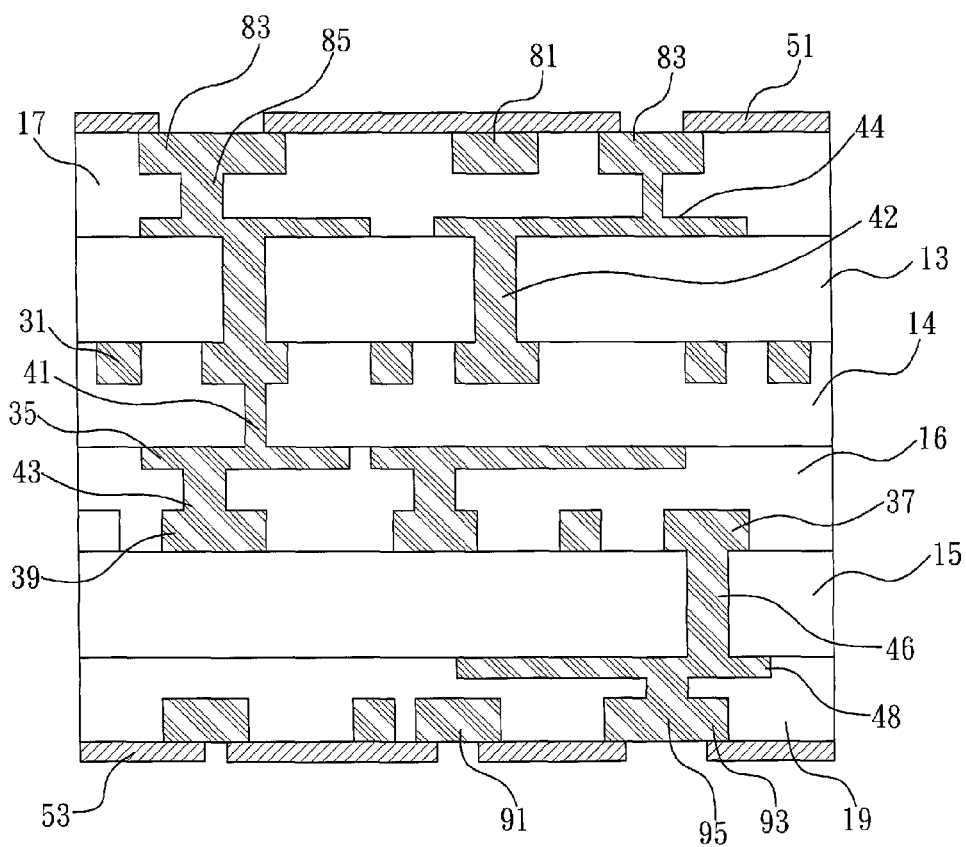

The step of fourth pressing S55 is to press the second stacked structure 72 and the third stacked structure 74 against the upper and lower surfaces of pre-laminating structure 77, respectively. That is, the second stacked structure 72, the pre-laminating structure 77 and the third stacked structure 74 are stacked from top to bottom. The step of third removing S55 is to remove the third carrier plate 530, the fourth carrier plate 540 and the electroplated seed layers 20 such that the third circuit pattern layer 80 and the fourth circuit pattern layer 90 are exposed to the upper surface of the fifth plastic sheet 17 and the lower surface of the sixth plastic sheet 19, respectively. As shown in FIG. 7D, the step of post-laminating process S59 is forming fifth and sixth openings at the center of the third connection pads 83 and the fourth connection pads 93, respectively. Then, forming fifth connection plugs 85 and sixth connection plugs 95 which are connected to the second interlayer connection pads 46 and the third interlayer connection pads 48, respectively, by plating the conductive material. Moreover, the step of post-laminating process S59 further includes forming a solder mask 51 and a second solder mask 53. As shown in FIG. 7E, the solder mask 51 is formed on the upper surface of the fifth plastic sheet 17, and covers the third circuit patter layer 81 and part of the third connection pad 83. Similarly, the second solder mask 53 is formed on the lower surface of the sixth plastic sheet 19, and covers the fourth circuit patter layer 91 and part of the fourth connection pad 93.

In the present invention the first carrier plate 510, the second carrier plate 520, the third carrier plate 530 and the fourth carrier plate 540 are made from metal material, such as stainless steel or aluminum. Especially, the surface is smooth and has a roughness defined by Ra<0.35 μm and Rz<3 μm.

One feature of the present invention is that one interlayer connection pad is provided between two circuit pattern layers so as to form the specific stacked structure with indirect connection, wherein each circuit pattern layer is connected to the corresponding interlayer connection pad via the corresponding connection pad, and the width of the interlayer connection pad is smaller than alignment tolerance, thereby overcoming the problem due to alignment tolerance and implementing the final multilayer structure by stacking the circuits with much finer line and smaller pitch.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of manufacturing a multilayer substrate structure for fine line, comprising:

a pre-treatment step consisting of a first preparation step, a first pressing step, a first drilling step and a first filling step, wherein the first preparation step consisting of preparing a first plastic sheet and a first carrier plate provided with a first circuit pattern layer, wherein the first circuit pattern layer includes a first circuit pattern and at least one first connection pad; the first pressing step consisting of pressing the first carrier plate against the first plastic sheet to embed the first circuit pattern layer into an upper surface of the first plastic sheet; the first drilling step consisting of forming at least one first opening on a lower surface of the first plastic sheet in alignment with the first connection pad; and the first filling step consisting of filling the first opening with an electrically conductive material to form at least one first connection plug, wherein the first connection plug is connected to the first connection pad, at least one interlayer connection pad is provided on the lower surface of the first plastic sheet and is made from the electrically conductive material, and the interlayer connection pad is connected to the first connection plug so as to form a first stacked structure;

a pressing step consisting of pressing the first stacked structure against a second plastic sheet and a second carrier plate provided with a second circuit pattern layer such that the lower surface of the first plastic sheet is connected to an upper surface of the second plastic sheet, the second circuit pattern layer is embedded into a lower surface of the second plastic sheet, and the interlayer connection pad is embedded into the upper surface of the second plastic sheet, wherein the second circuit pattern layer includes a second circuit pattern and at least one second connection pad, the second connection pad having a shape of a ring with a central region; and a post-treatment step consisting of a removing step, a second drilling step and a second filling step, the removing step consisting removing the first and second carrier plates such that the first and second circuit pattern layers are exposed to the upper surface of the first plastic sheet and the lower surface of the second plastic sheet, respectively; the second drilling step consisting of drilling the lower surface of the second plastic sheet to form one second opening in alignment with the central region of the second connection pad to stop at the interlayer connection pad; and the second filling step consisting of filling the second opening with the electrically conductive material to form a second connection plug, wherein the second connection plug is connected to the interlayer connection pad so as to form a core stacked structure, wherein the interlayer connection pad has a width of 40 to 100 μm.

2. The method as claimed in claim 1, further comprising:

a third pressing step to press a third plastic sheet and a fourth plastic sheet on the top and the bottom of the core stacked structure;

a third preparation step is to form third connection plugs in the third plastic sheet and fourth connection plugs in the fourth plastic sheet by using drilling and filling, then to form second interlayer connection pads corresponding to the third connection plugs on the upper surface of the third plastic sheet, and to form third interlayer connection pads corresponding to the fourth connection plugs on the lower surface of the fourth plastic sheet, such that a pre-laminating structure is formed, wherein the third connection plugs and the fourth connection plugs are connecting to the first connection pads and the second connection pads, respectively, and to form a second stacked structure and a third stacked structure as the first preparation step, wherein the second stacked structure includes a third carrier plate, a third circuit pattern layer formed on the lower surface of the third carrier plate, and a fifth plastic sheet; the third circuit pattern layer includes a third circuit pattern and a third connection pad in form of a ring, and is embedded into the upper surface of the fifth plastic sheet, and the third stacked structure includes a fourth carrier plate, a fourth circuit pattern layer formed on the upper surface of the fourth carrier plate, and a sixth plastic sheet, the fourth circuit pattern layer includes a fourth circuit pattern and a fourth connection pad in form of a ring, and is embedded into the lower surface of the sixth plastic sheet;

a fourth pressing step is to press the second stacked structure and the third stacked structure against the upper and lower surfaces of pre-laminating structure, respectively;

a third removing step is to remove the third carrier plate, the fourth carrier plate such that the third circuit pattern layer and the fourth circuit pattern layer are exposed to the upper surface of the fifth plastic sheet and the lower surface of the sixth plastic sheet, respectively, and a post-laminating process step is to form fifth and sixth openings at the center of the third connection pads and the fourth connection pads, respectively, then to form fifth connection plugs and sixth connection plugs which are connected to the second interlayer connection pads and the third interlayer connection pads, respectively, by plating the conductive material, wherein the width of the second interlayer connection pads and the third interlayer connection pads is 40~100 μm.

3. The method as claimed in claim 2, wherein an electroplated seed layer is formed between the third carrier plate and the third circuit pattern layer, and between the fourth carrier plate and the fourth circuit pattern layer, and the electroplated seed layers are removed in the third removing step.

4. The method as claimed in claim 2, wherein post-laminating process step further comprising a step of forming solder mask, wherein a first solder mask and a second solder mask are formed on the upper surface of the fifth plastic sheet and the lower surface of the sixth plastic sheet, respectively, the first solder mask covers the third circuit pattern layer and part of the third connection pad, and the second solder mask covers the fourth circuit pattern layer and part of the fourth connection pad.

5. The method as claimed in claim 2, wherein each of the first, second, third and fourth carrier plates is selected from a group consisting of stainless steel and aluminum with surface roughness defined by Ra<0.35 μm and Rz<3 μm.

6. The method as claimed in claim 1, further comprising a step of forming solder mask, wherein a first solder mask and a second solder mask are formed on the upper surface of the first plastic sheet and the lower surface of the second plastic sheet, respectively, the first solder mask covers the first circuit pattern layer and part of the at least one first connection pad, and the second solder mask covers the second circuit pattern layer and part of the at least one second connection pad.

7. The method as claimed in claim 1, wherein an electroplated seed layer is formed between the first circuit pattern layer and the first carrier plate, and another electroplated seed layer between the second circuit pattern layer and the second carrier plate, and the electroplated seed layers are removed in the step of removing.

* * * * *